United States Patent [19]
Tilton et al.

[11] Patent Number: 5,880,931
[45] Date of Patent: Mar. 9, 1999

[54] SPRAY COOLED CIRCUIT CARD CAGE

[76] Inventors: Donald E. Tilton, 14402 SR195, Colton, Wash. 99113; Kevin D. Seaney, 430 SE. Hill St.; Ryan J Baddeley, 264 NW. Clay Ct., both of Pullman, Wash. 99163; Charles L Tilton, 904 Summit St, Colton, Wash. 99113

[21] Appl. No.: 44,841

[22] Filed: Mar. 20, 1998

[51] Int. Cl.$^6$ .................................................. H05K 7/20
[52] U.S. Cl. .................. 361/690; 361/689; 361/698; 174/15.1; 165/80.4; 165/908; 62/64; 62/259.2; 312/223.2
[58] Field of Search .................................. 361/687, 688, 361/689, 698, 699, 700; 174/15.1; 165/80.4, 908; 62/64, 259.2; 312/223.2

[56] References Cited

U.S. PATENT DOCUMENTS

| | | | |
|---|---|---|---|
| 3,917,370 | 11/1975 | Thornton et al. | 439/194 |
| 5,057,968 | 10/1991 | Morrison | 361/700 |
| 5,718,117 | 2/1998 | McDunn et al. | 62/64 |

*Primary Examiner*—Gregory Thompson
*Assistant Examiner*—Boris L. Chervinsky
*Attorney, Agent, or Firm*—David S. Thompson

[57] ABSTRACT

A spray cooled circuit card cage includes opposed card guides separated by opposed card cage side panels. Each card guide carries a top rail and lower manifold. The manifold provides coolant fluid to a plurality of spray plate assemblies, which direct a spray of coolant over the top surface of the electronic cards carried between the card guides. A VME or other type of electronic back plane is typically attached to the manifolds and a back plane support, and is in electronic communication with the circuit cards.

6 Claims, 8 Drawing Sheets

SPRAY COOLED CIRCUIT CARD CAGE

CROSS-REFERENCES

There are no applications related to this application filed in this or any foreign country.

BACKGROUND

Electronic component circuit card cages used to support printed circuit cards within an electronic system's enclosure are well-known and widely used. Such card cages support a number of electronic cards in a parallel relationship, typically with narrow clearance between adjacent cards. Each card is plugged into an edge connector carried by an electronic back plane that is perpendicular to the circuit cards. Due to the proximity of the cards within the cage, the location of the cage within an enclosure, and the electrical power consumed, substantial heating may result.

To remove the heat, it is common to have one or more fans to draw air through the enclosure where it circulates about the circuit cards carried by the card cage. However, due to the orientation of the cards and the back plane and the density of the electronics components, air circulation is often inadequate to remove the heat generated while keeping the components within their thermal tolerances.

A more aggressive strategy to remove heat energy is to seal the enclosure and to use spray plates which release a mist of fine droplets of coolant fluid. A greater quantity of heat energy may be removed in this manner, but considerable cost is involved in sealing the enclosure and supporting each circuit card adjacent to an associated spray plate.

For the foregoing reasons, there is a need for an electronic circuit card cage that can support a plurality of circuit cards and which has built-in means to spray cool those cards during operation.

SUMMARY

The present invention is directed to an apparatus that satisfies the above needs. A novel spray cooled circuit card cage is provided that supports a number of electronic circuit cards in communication with an electronic back plane. A plurality of spray plate assemblies direct coolant spray across the surface of each of the circuit cards, which are carried within a sealed enclosure.

The spray cooled circuit card cage of the present invention provides some or all of the following structures.

(A) Two opposed card cage side panels. A back plane support element typically connects a lower portion of each of the opposed card cage side panels, and supports and reduces stress on the back plane.

(B) Two opposed card guides are adjacent to the two opposed card cage side panels. A top rail is attached to the top edge of each card guide. The opposed ends of the top rails are attached to the opposed card cage side panels.

(C) In a preferred embodiment, one manifold is carried by a lower edge of each card guide. Each manifold defines a manifold fluid chamber which is in communication with a plurality of adjacent spray plate assemblies. A fluid interconnect tube connects the manifolds, allowing fluid transfer from one to the other.

(D) The plurality of spray plate assemblies, carried by the opposed card guides, are in fluid communication with the manifold associated with the carrying card guide. Each spray plate assembly directs coolant spray across the upper surface of an adjacent circuit card carried by the spray cooled card cage. Each spray plate assembly typically includes:

(a) An elongate body, defining a spray plate fluid chamber, typically connected at upper and lower locations to the card guide.
  (b) A fluid inlet, carried by the body, allows coolant fluid to flow from the manifold fluid chamber to the spray plate fluid chamber.
  (c) An O-ring or similar seal carried by the fluid inlet provides a fluid-tight seal between the spray plate and the manifold.
  (d) At least one spray plate is carried by each elongate spray plate body, adjacent to the spray plate fluid chamber. Each spray plate defines at least one spray nozzle or atomizer. The atomizers are typically arranged in a manner that results in the coolant spray being concentrated in the areas of highest electronic component density or at electronic components that are particularly heat-sensitive or heat-producing. A filter screen, carried between the spray plate and the fluid chamber, prevents the atomizers from clogging.

A more detailed description of one embodiment of the invention includes the following:

(E) An auxiliary spray plate assembly, receiving fluid through a flexible or rigid fluid pipe connected to one of the spray plate assemblies, is adapted for cooling components producing particularly high levels of heat. The auxiliary spray plate assembly provides a spray plate with nozzles directing a coolant spray perpendicular to the circuit card, and directly aimed at heat-generating and heat-sensitive components.

It is therefore a primary advantage of the present invention to provide a novel spray cooled circuit card cage that both supports a number of circuit cards in a close relationship and provides means to provide spray cooling to the circuit cards from two directions, thereby preventing the build-up of heat in areas where obstructions shadow the spray coming from one direction.

Another advantage of the present invention is to provide a spray cooled circuit card cage that allows the spray plates carried by the spray plate assemblies to be cost effectively customized to associate the location of spray atomizers with the location of heat-producing and heat-sensitive components on the various circuit cards, and to therefore tailor the coverage of the coolant spray in the most efficient manner.

A still further advantage of the present invention is to provide a spray cooled circuit card cage having two opposed card guides, each having an elongate manifold that functions both as a structural component which replaces the extruded aluminum rails used in standard card cages, and also as a reservoir and passageway for coolant fluid flow in communication with a number of spray plate assemblies, each carried by the card guides.

DRAWINGS

These and other features, aspects, and advantages of the present invention will become better understood with regard to the following description, appended claims, and accompanying drawings where:

DESCRIPTION

Referring generally to FIGS. 1 through 8, a spray cooled circuit card cage 100 constructed in accordance with the principles of the invention is seen. The spray cooled circuit card cage is adapted for use in a sealed enclosure containing a coolant suitable for use with electronic components. The spray cooled circuit cage seen in FIG. 1 includes opposed card guides 300 separated by opposed card cage side panels 200. Each card guide carries a top rail 400 and lower manifold 500. The manifold provides coolant fluid to a plurality of spray plate assemblies 600, which direct a spray over the top surface of the electronic cards 75 carried by the card guides. A VME or other type of electronic back plane 50 is typically attached to the manifolds and to a back plane support 450 carried between the side panels, and is in electronic communication with the circuit cards.

Figure 1:
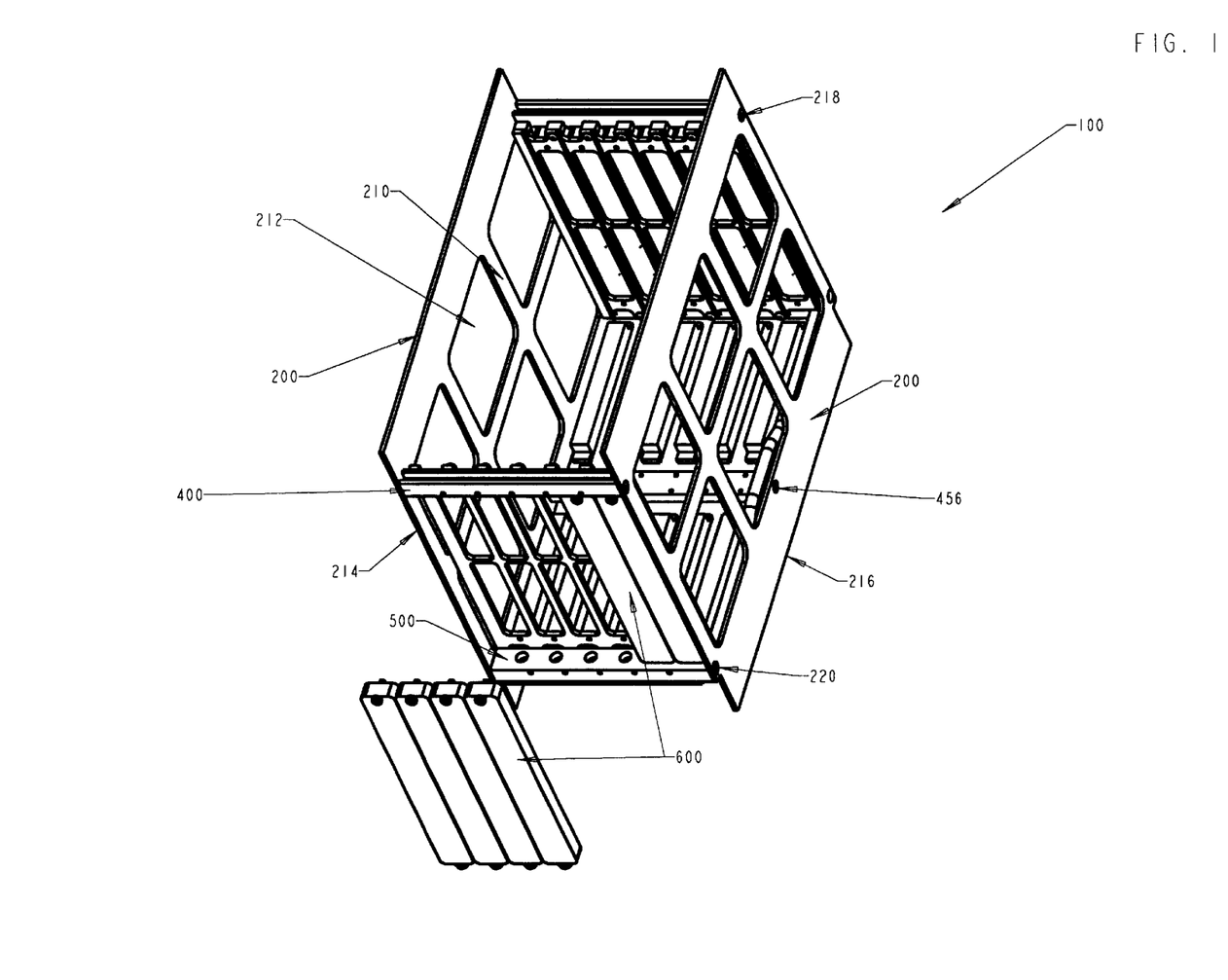
FIG. 1 is a perspective view of a version of the spray cooled circuit card cage of the invention, carrying an electronic back plane, having four spray plate assemblies removed from the manifold and card guide to better illustrate the structure.
Figure 2:
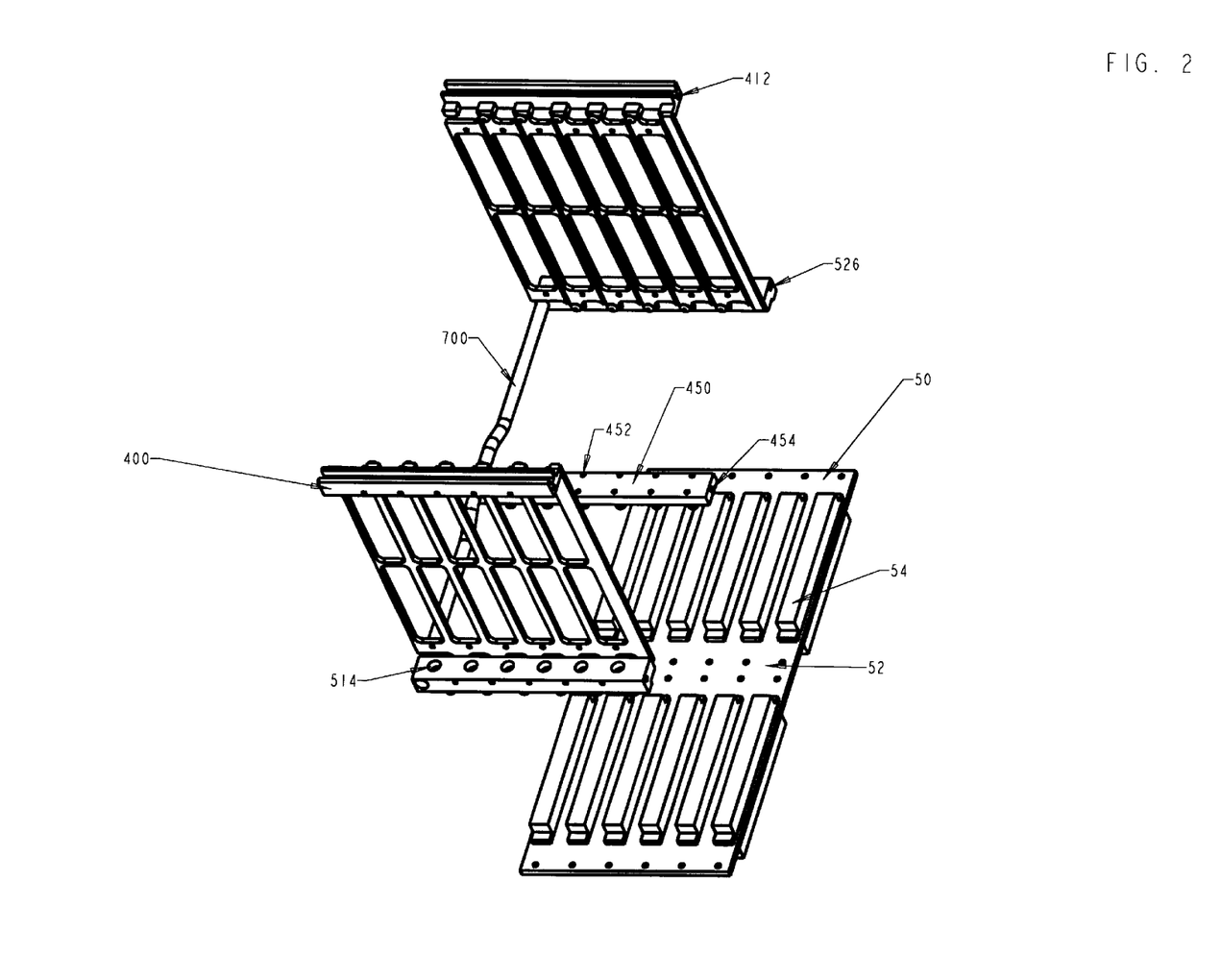
FIG. 2 is an exploded perspective view of portions of the spray cooled circuit card cage of FIG. 1, showing the opposed card guides, top rails, manifolds, the fluid interconnect tube and back plane support, with an example of an electronic back plane suitable for use with the circuit card cage shown for illustrative purposes.

Referring to FIGS. 1 and 2, an example of a back plane 50 usable with the spray cooled circuit card cage of invention is seen. The back plane may be of any type, including VME, VXI, ISA, PCI or other known standard or custom type. The inside surface 52 of the back plane supports a number of components including edge connectors 54 which allow the insertion of a number of printed circuit cards 75 having corresponding edge connectors. The back plane is typically a one or more layer printed circuit board allowing communication between the various inserted circuit cards and other electronics within the enclosure.

As seen in FIGS. 1–3, 6 and 8, the spray cooled card cage 100 provides two opposed card guides 300 which are adapted to support a plurality of circuit cards 75. In a preferred embodiment of the invention, each card guide is formed of a grill-like body 310 which defines a number of openings 312, which allow for the spray to pass through the card guide.

Figure 3:
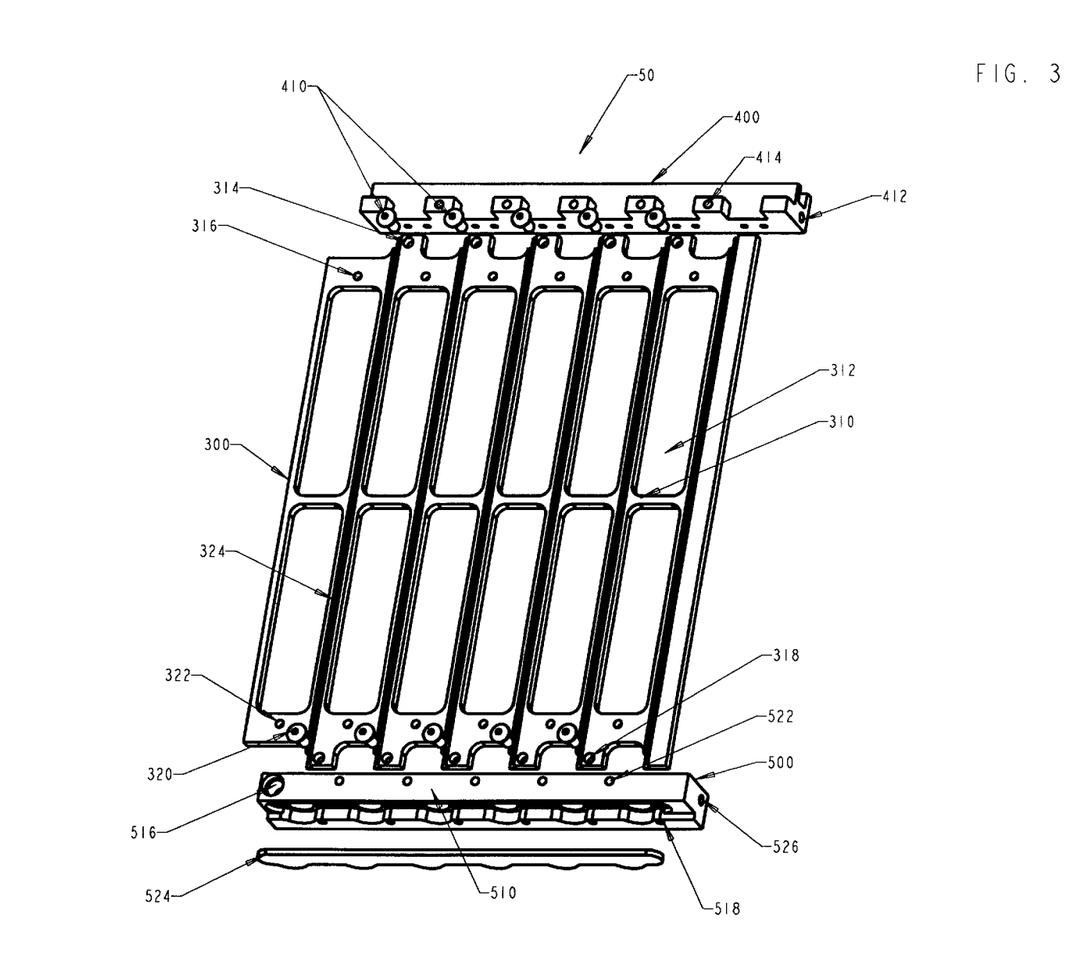
FIG. 3 is an exploded perspective view of one of the card guides, with the associated top rail and manifold.

An upper portion of the body 310 defines several upper fastening holes 314, which allow attachment of an upper edge of the body to the top rail 400 by a fastener, such as threaded fastener 410. The upper portion of the body also defines several upper fastening holes 316 which allow attachment of an upper portion of the body 610 of each spray plate assembly 600. A lower portion of the body 310 defines several lower fastening holes 318, which allow attachment of a lower edge of the body to the manifold 500 by fastener 320. The lower portion of the body also defines several lower fastening holes 322, which allow attachment of a lower portion of the body 610 of each spray plate assembly 600.

Referring particularly to FIG. 3, it can be seen that the card guide defines several elongate channels or card slots 324, adapted to carry the edges of the electronic circuit cards 75. These card slots allow the card guide to support any desired number of electronic circuit cards, typically although not necessarily, in an evenly spaced manner perpendicular to the card guide 300 and back plane 50.

Referring particularly to FIG. 1, two opposed cage sides 200 separate the card slots 324 of the card guides 300 by a distance incrementally greater than the length of the electronic cards 75 carried by the card cage. Each card cage side panel is typically made of sheet metal having cross members 210 defining openings 212. A lower edge 216 is adjacent to the electronic back plane, and opposed side edges 214 are adjacent to the opposed card guides 300.

As seen particularly in FIG. 1, upper fasteners 218 connect the card cage side panels to threaded holes 412 defined in the ends of the top rails 400, while lower fasteners 220 connect the card cage side panels to threaded holes 526 defined in the ends of the manifold 500.

Referring particularly to FIGS. 1 and 3, a top rail 400 is attached to the upper portion of the card guide 300 by fasteners 410. Threaded holes 412, defined in each end of the top rail, allow fasteners 218 to connect the card cage side panels 200 to the ends of the rails. The top rail also defines a plurality of threaded holes 414 which may be aligned with the upper fastening holes 314 of the card guide 300, allowing the card guide to be attached to the top rail by threaded fasteners 410.

Referring to FIGS. 1 and 2, a back plane support 450 can be seen. The back plane support reduces the stress on the back plane 50 by supporting it in the middle. Fastening holes 452 allow attachment of the support 450 to the back plane. Fastening holes 454 and fasteners 456 allow attachment of the ends of the back plane support to a lower middle portion of the card cage side panels 200.

Figure 4A:
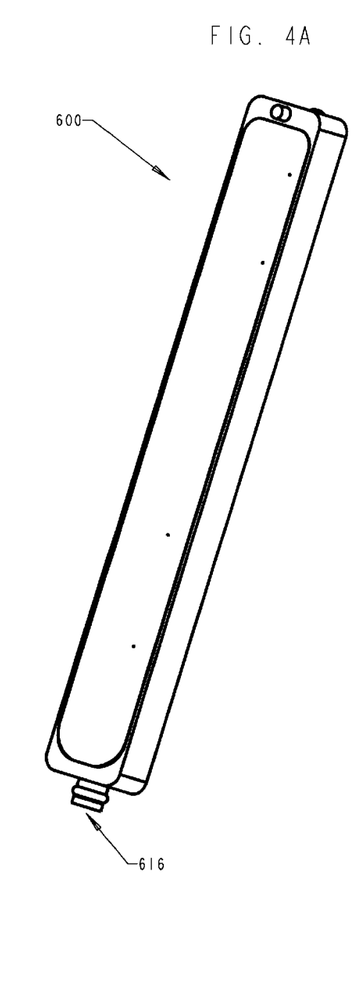
FIG. 4A is a perspective view of an assembled spray plate assembly.
Figure 4B:
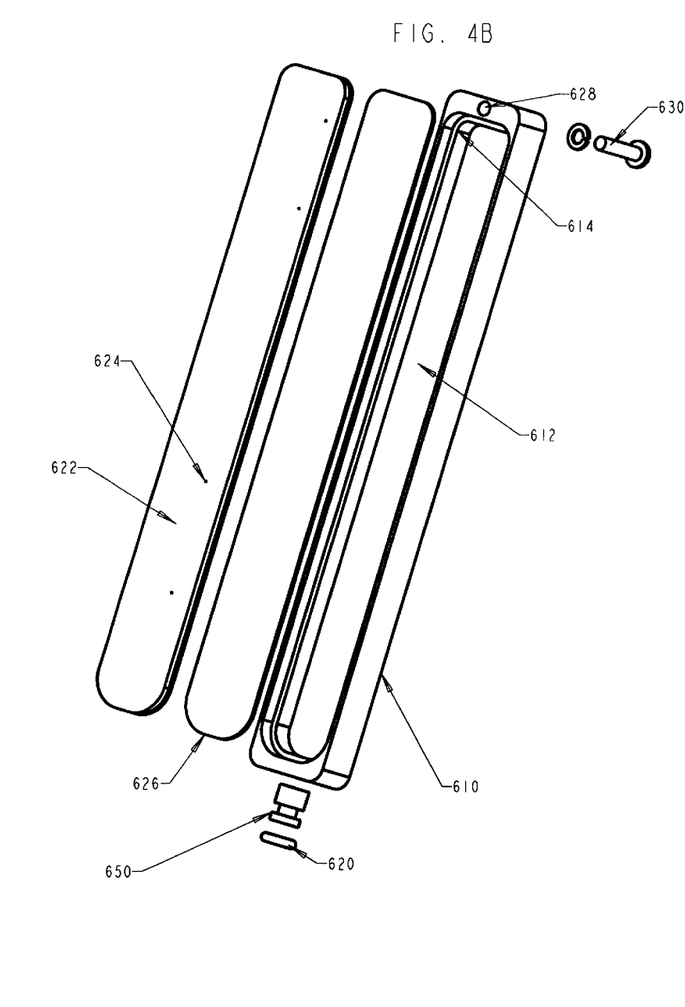
FIG. 4B is an exploded view of the spray plate assembly of FIG. 4A.

Referring to FIGS. 4A and 4B, a spray plate assembly 600 constructed in accordance with the invention is seen. The spray plate assembly provides a body 610 which defines a spray plate fluid chamber 612. A rim or shoulder 614 supports the spray plate 622 in a fluid-tight manner. A filter screen 626 may be carried between the spray plate and the fluid chamber to prevent clogging of the spray atomizers. In a preferred embodiment seen in FIG. 3, the spray plate assemblies are attached to the upper or lower fastening holes 316, 322 of the card guides 300 by threaded fasteners 630 installed through fastening holes 628 defined in an upper portion of the spray plate body 610.

Referring in particular to FIG. 4B, a preferred version of the invention provides a fluid inlet 616, defining a channel 618, having an O-ring seal 620 that is insertable into the fluid exit port 514 of a manifold 500. Alternatively, the fluid inlet could extend from the manifold and be insertable into the spray plate assembly.

The spray plate 622 defines a pattern of spray nozzles or atomizers 624 that are distributed in a manner that is appropriate for a specific application. For example, the distribution of spray nozzles is typically determined by the distribution of heat-generating and heat-sensitive electrical components on the adjacent circuit card. Thus the spray nozzles may be arranged advantageously to result in the greatest concentration of the spray of coolant being directed to the greatest concentration of heat-generating components or the most heat sensitive components. Alternatively, the spray nozzles can be arranged in a generic pattern that is calculated to be effective on a wide variety of circuit cards, without the need to be custom-designed.

The spray plate assemblies 600 carried by opposed card guides 300 tend to direct atomized coolant spray in opposed directions. The movement of the coolant in opposed directions reduces the likelihood of individual components "shadowing" other components by physically blocking the coolant spray. For example, a physically large component may block the coolant spray from nozzles carried by a first spray plate assembly carried by a first card guide, thereby preventing the spray from reaching a more distant second group of components. In that case, coolant spray from nozzles carried by a second spray plate assembly carried by a second card guide would reach the second group of components.

Additionally, where coolant spray is directed from spray plate assemblies carried by opposed card guides, the droplets of coolant discharged by opposed spray plates tend to collide above the circuit card to be cooled. This can cause disintegration of the droplets, forming small particles which then drop onto adjacent surfaces.

Also, where coolant spray is directed from spray plate assemblies carried by opposed card guides, the collision of the coolant sprays from opposed directions may form a stagnation area, where the velocity of coolant particle movement is reduced. The location of the stagnation area, relative to the circuit card to be cooled, may be altered, typically by adjusting the relative size and placement of opposing atomizers 624. For example, by increasing the size and number of atomizers on one spray plate, the stagnation area may be moved away from that spray plate. The size and location of the atomizers on each spray plate 622 should therefore be selected to minimize the average temperature of the electronic components carried by the circuit card 75, with particular attention being paid to keeping each component within rated thermal values.

Figure 7:
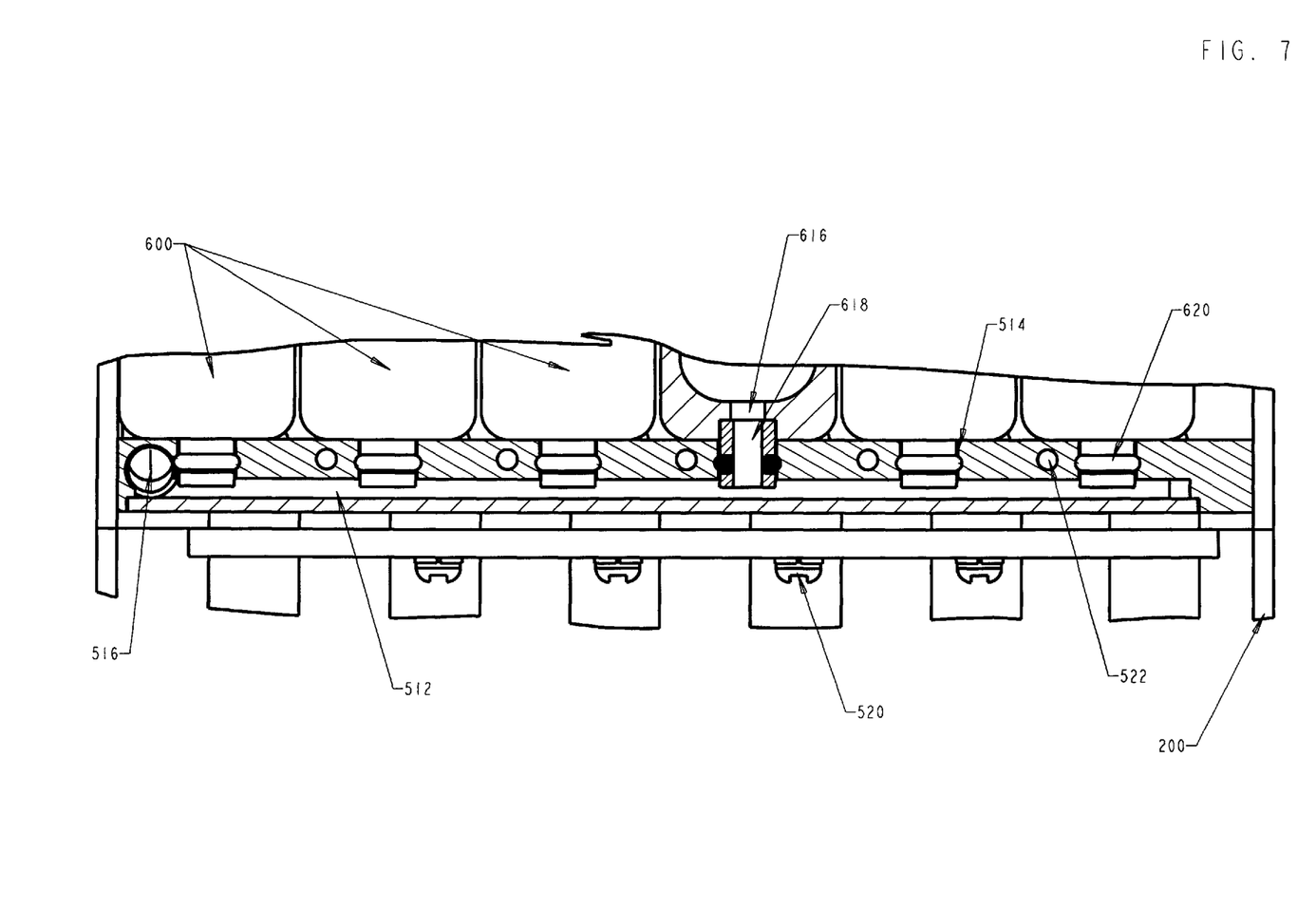
FIG. 7 is an enlarged view of a portion of the manifold and spray plate assemblies seen in FIG. 6, having one of the spray plate fluid inlets drawn in cross-section.

As seen in FIG. 1, two manifolds 500 are attached to the lower portion of the two opposed card guides 300, and are attached at each end to the lower portion of opposed card cage side panels 200. The rigidity and elongate design of the manifold 600 replaces the extruded aluminum rails typically used in the construction of card cages. Referring particularly to FIG. 3, fastening holes 522 allow fasteners 320 to attach lower fastening holes 318 of the card guide 300 to the manifold 500. Referring to FIGS. 3 and 7, fasteners 520 and associated threaded holes 518 in the manifold allow attachment of the back plane 50 to the manifold.

Each manifold provides an elongate body 510 defining an internal fluid chamber 512 which provides coolant fluid to the spray plate fluid chambers 612 within the individual spray plate assemblies 600. A removable manifold lid 524, best seen in FIG. 3, allows cleaning of the fluid chamber 512. Referring in particular to FIG. 7, a plurality of fluid exit ports 514 allows connection to the fluid inlets 616 of a like number of spray plate assemblies 600. A single fluid entry port 516 allows coolant fluid under pressure to be introduced into the chamber defined within the manifold. Referring to FIG. 2, a fluid interconnect tube 700 allows one manifold to supply the other with coolant fluid.

Figure 5A:
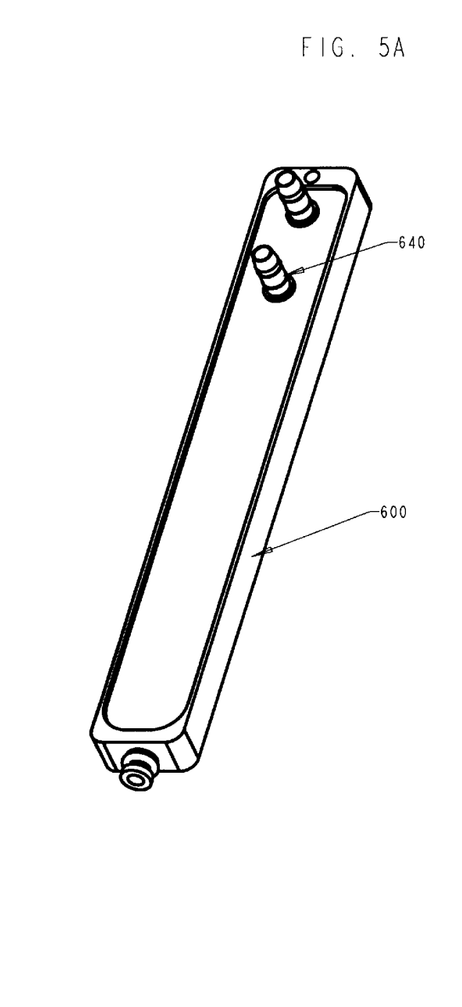
FIG. 5A is a perspective view of an assembled spray plate assembly having a spray plate with two fluid exit ports attached for use in support of auxiliary spray plate assemblies.
Figure 5B:
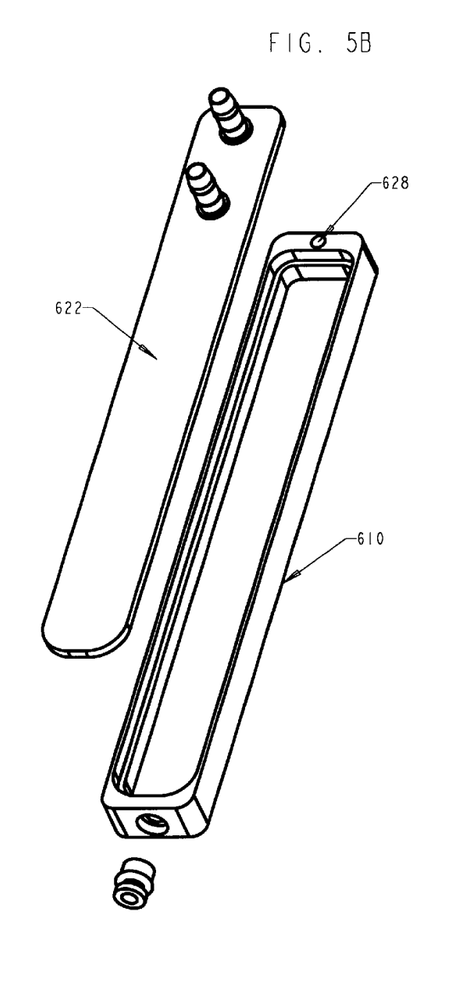
FIG. 5B is an exploded perspective view of the spray plate assembly of FIG. 5A.
Figure 6:
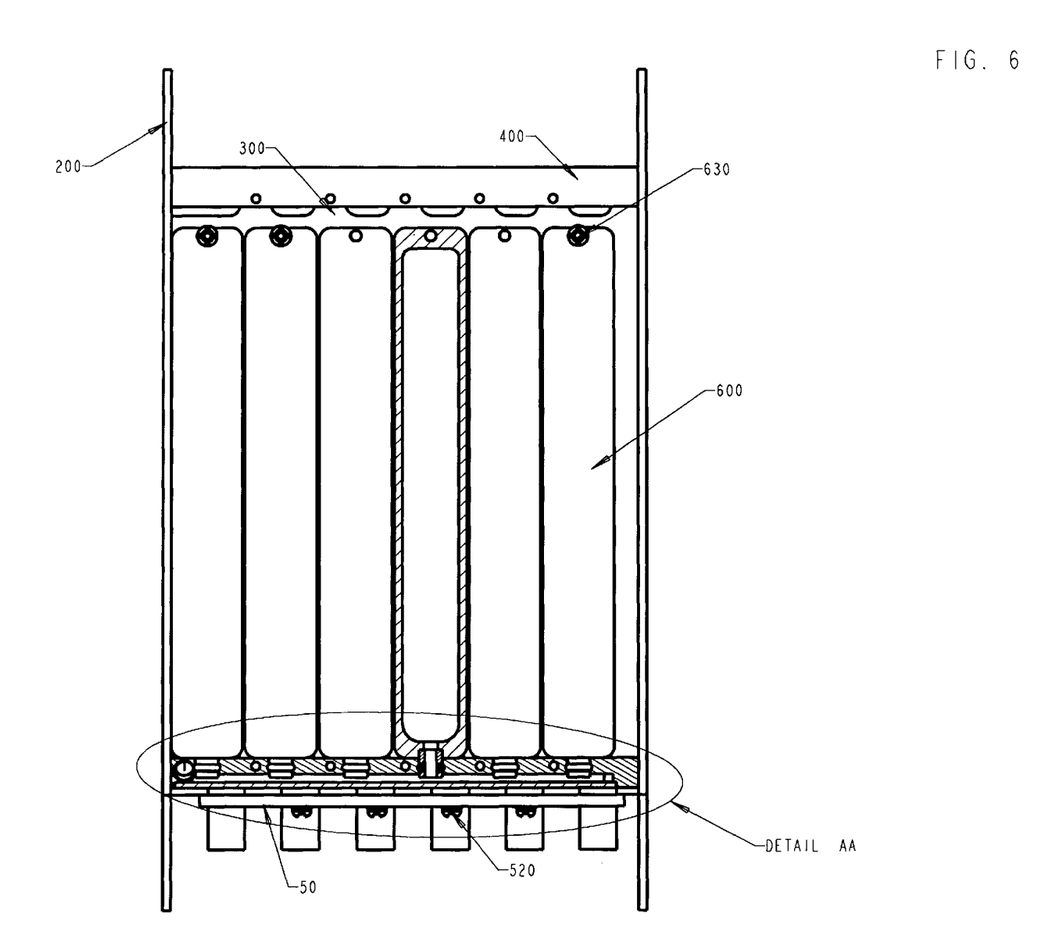
FIG. 6 is an orthographic view of a card guide having six attached spray plate assemblies, showing the manifold in cross-section, to show the fluid inlets forming the interconnection between the manifold and the spray plate assemblies.
Figure 8:
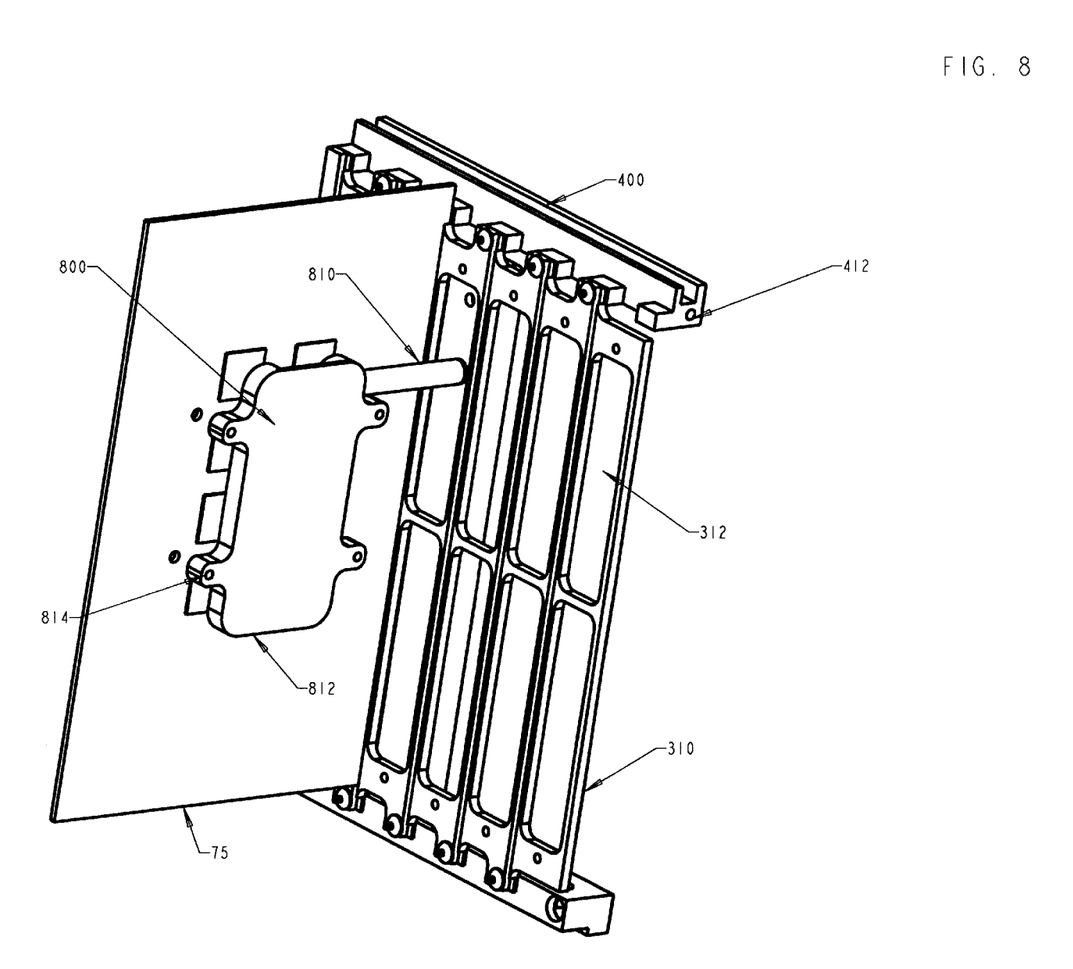
FIG. 8 is a perspective view of a card guide supporting a spray plate assembly having a fluid exit port in communication with an auxiliary spray plate assembly adjacent to an electronic card to be cooled.

Referring to FIGS. 5 and 8, the structure of the auxiliary spray plate assembly 800 can be understood. FIGS. 5A and 5B disclose the use of one or more fluid exit ports 640, supported by the spray plate 622. The fluid exit ports allow coolant to flow from the fluid chamber 612 of the spray plate assembly 600 to the auxiliary spray plate assembly 800. Atomizers carried by the spray plate assembly direct coolant spray at components carried by an electronic card adjacent to the spray plate assembly. The proximity of the spray plate assembly 800 to components having particularly demanding cooling requirements helps to deliver the required coolant levels.

A flexible or rigid fluid pipe 810, extending from the fluid exit port 640, supplies coolant fluid to the body 812 of the auxiliary spray plate assembly, such as that disclosed in U.S. Pat. No. 5,220,804, which is hereby incorporated by reference. Fastening holes 814 may be used to form a direct attachment of the body 812 to the electronic card 75, thereby supporting the auxiliary spray plate assembly 800.

In general, the atomizers required in the construction of any of the above assemblies should be manufactured in any suitable manner, such as that disclosed by U.S. Pat. No. 5,220,804.

To use the spray cooled circuit card cage constructed according to the above specification, the number of circuit cards is first determined. Generally, the number of spray plate assemblies carried by each card guide is chosen to be equal to the number of circuit cards containable within the card cage. The areas of greatest heat-production and heat-sensitivity on each card are then determined. The required number of spray plates 622 are then created, each spray plate having a pattern of spray atomizers 624 that is most appropriate to direct spray coolant to the components and locations of the adjacent circuit card that are most temperature sensitive or that produce the most heat.

The spray plates 622 are then assembled into the spray plate assemblies 600. The fluid inlets 616 spray plate assemblies are then inserted into the fluid exit ports 514 of the manifold 500. Fasteners 630 attach the spray plate assemblies to the card guides 300. Where a slot in the circuit card cage is not to be used, spray plates having no spray atomizers may be used in a spray assembly, or a plug may be used to seal the fluid exit port of the manifold adjacent to the unused circuit card slot.

The spray cooled circuit card cage is then placed in a sealed enclosure and a hose carrying coolant fluid is attached to the fluid entry port 516. When pressure is applied to the fluid entry port, the spray nozzles 624 produce an atomized mist of coolant droplets that is directed at the most thermally sensitive and highest heat-generating, components.

The previously described versions of the present invention have many advantages, including a primary advantage of providing a novel spray cooled circuit card cage that both supports a number of circuit cards in a close relationship and provides means to provide spray cooling to the circuit cards from two directions, thereby preventing the build-up of heat in areas where obstructions shadow the spray coming from one direction.

Another advantage of the present invention is to provide a spray cooled circuit card cage that allows the spray plates carried by the spray plate assemblies to be cost effectively customized to associate the location of spray atomizers with the location of heat-producing and heat-sensitive components on the various circuit cards, and to therefore tailor the coverage of the coolant spray in the most efficient manner.

A still further advantage of the present invention is to provide a spray cooled circuit card cage having two opposed card guides, each having an elongate manifold that functions both as a structural component which replaces the extruded aluminum rails used in standard card cages, and also as a reservoir and passageway for coolant fluid flow in communication with a number of spray plate assemblies, each carried by the card guides.

Although the present invention has been described in considerable detail and with reference to certain preferred versions, other versions are possible. For example the number of spray plate assemblies contained within each spray plate side unit is somewhat arbitrary, and that number may be adapted for any specific application. Similarly, the number of spray plates carried by each spray plate assembly is also somewhat arbitrary. Additionally, while a preferred version of the invention is applied to VME circuit cards, a similar version of the invention is adaptable to alternate circuit card types. Therefore, the spirit and scope of the appended claims should not be limited to the description of the preferred versions disclosed.

In compliance with the U.S. Patent Laws, the invention has been described in language more or less specific as to methodical features. The invention is not, however, limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A spray cooled card cage supporting at least one circuit card, the spray cooled card cage comprising:
   (A) two opposed card cage side panels;
   (B) two opposed card guides, each adjacent to the two opposed card cage side panels;
   (C) at least one manifold, carried by a card guide lower edge and attached to the two opposed card cage side panels, the manifold defining a manifold fluid chamber; and
   (D) a plurality of spray plate assemblies, each spray plate assembly carried by one of the opposed card guides and in fluid communication with a manifold fluid chamber, the spray plate assembly oriented to direct coolant spray across an upper surface of the circuit cards.

2. The spray cooled card cage of claim 1, wherein the spray plate assemblies each comprise:
   (a) an elongate body defining a spray plate fluid chamber, connected at upper and lower locations to the card guide;
   (b) a fluid inlet, carried by the body, allows fluid communication between the manifold fluid chamber and the spray plate fluid chamber;
   (c) sealing means, carried by the fluid inlet, for providing a fluid-tight seal between the spray plate and the manifold;
   (d) at least one spray plate, carried by each elongate spray plate body, adjacent to the spray plate fluid chamber, each spray plate defining at least one atomizer; and
   (e) a filter screen, carried between the spray plate and the spray plate fluid chamber.

3. The spray cooled card cage of claim 2, additionally comprising:
   (A) a top rail, carried by an upper edge of each card guide, the top rail having opposed ends attached to the two opposed card cage side panels.

4. The spray cooled card cage of claim 3, additionally comprising an auxiliary spray plate assembly, attachable directly to one of the at least one circuit cards, the auxiliary spray plate in fluid communication with one of the spray plate assemblies.

5. A spray cooled card cage supporting at least one circuit card, the spray cooled card cage comprising:
   (A) two opposed card cage side panels;
   (B) two opposed card guides, each adjacent to the two opposed card cage side panels;
   (C) one manifold carried by a lower edge of each card guide and attached to the two opposed card cage side panels, each manifold defining a manifold fluid chamber;
   (D) a top rail, carried by an upper edge of each card guide, the top rail having opposed ends attached to the two opposed card cage side panels; and
   (E) a plurality of spray plate assemblies, each spray plate assembly carried by one of the opposed card guides and in fluid communication with a manifold fluid chamber, the spray plate assembly oriented to direct coolant spray across an upper surface of the circuit cards, wherein each spray plate assembly comprises:
      (a) an elongate body defining a spray plate fluid chamber, connected at upper and lower locations to the card guide,
      (b) a fluid inlet, carried by the body, allows fluid communication between the manifold fluid chamber and the spray plate fluid chamber;
      (c) sealing means, carried by the fluid inlet, for providing a fluid-tight seal between the spray plate and the manifold;
      (d) at least one spray plate, carried by each elongate spray plate body, adjacent to the spray plate fluid chamber, each spray plate defining a plurality atomizers; and
      (e) a filter screen, carried between the spray plate and the spray plate fluid chamber.

6. The spray cooled card cage of claim 5, additionally comprising an auxiliary spray plate assembly, attachable directly to one of the at least one circuit cards, the auxiliary spray plate in fluid communication with one of the spray plate assemblies.

* * * * *